US009450576B2

(12) United States Patent
Lee

(10) Patent No.: US 9,450,576 B2
(45) Date of Patent: Sep. 20, 2016

(54) SWITCHING DEVICE HAVING A GOOD ISOLATION CHARACTERISTIC, METHOD FOR IMPROVING THE ISOLATION CHARACTERISTIC OF A SWITCHING DEVICE

(71) Applicant: AIROHA TECHNOLOGY CORP., Hsinchu (TW)

(72) Inventor: Chien-Kuang Lee, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 93 days.

(21) Appl. No.: 14/474,543

(22) Filed: Sep. 2, 2014

(65) Prior Publication Data

US 2015/0256168 A1    Sep. 10, 2015

(30) Foreign Application Priority Data

Mar. 7, 2014   (TW) .............................. 103107910 A

(51) Int. Cl.
*H03K 17/16*   (2006.01)
*H03K 17/06*   (2006.01)
*H03K 17/693*   (2006.01)

(52) U.S. Cl.
CPC ............ *H03K 17/16* (2013.01); *H03K 17/063* (2013.01); *H03K 17/693* (2013.01); *H03K 2017/066* (2013.01)

(58) Field of Classification Search
CPC .. H03K 17/16; H03K 17/063; H03K 17/693; H03K 2017/066
USPC .................................................. 333/101–103
See application file for complete search history.

(56) References Cited

U.S. PATENT DOCUMENTS

| 4,835,649 A | * | 5/1989 | Salerno .................. H02H 3/087 323/276 |
| 4,972,136 A | * | 11/1990 | Banura .................. G05F 1/573 323/275 |
| 6,069,503 A | * | 5/2000 | Doyle ................ H03K 17/6874 327/103 |

FOREIGN PATENT DOCUMENTS

| CN | 101965676 A | 2/2011 |
| TW | M4517353 U1 | 4/2013 |
| TW | M472359 U | 2/2014 |

\* cited by examiner

*Primary Examiner* — Kenneth B Wells
(74) *Attorney, Agent, or Firm* — Rosenberg, Klein & Lee

(57) ABSTRACT

A switching device having a good isolation characteristic is disclosed. The switching device comprises a switch unit and a control unit, wherein the control unit is connected to a power supply terminal, and connected to the switch unit via a control line and a power line. The control unit comprises a voltage regulator unit that is electrically connected to the power supply terminal and the power line of the switch unit. When the switch unit enters standby mode, the control unit provides an isolation voltage to the switch unit to effectively enhance the isolation characteristic of the switching device in the standby mode.

13 Claims, 7 Drawing Sheets

SWITCHING DEVICE HAVING A GOOD ISOLATION CHARACTERISTIC, METHOD FOR IMPROVING THE ISOLATION CHARACTERISTIC OF A SWITCHING DEVICE

BACKGROUND OF THE INVENTION

The present invention relates to a switching device having a good isolation characteristic. The invention relates also to a method for improving the isolation characteristic of a switch unit of a switching device so as to improve the isolation characteristic of the switching device.

Referring to FIG. 1, a block diagram of a conventional RF Front-end having a switch unit is shown. As illustrated, the RF Front-end 10 is adapted for transmitting and receiving wireless signals, comprising an antenna unit 11, a switch unit 13, at least one receiving path 15, a transmitting unit 17 and a control unit 19, wherein the control unit 19 is electrically coupled with the switch unit 13 and the transmitting unit 17, and adapted to provide power supply to the switch unit 13, and to turn on/off the switch unit 13.

In actual application, the control unit 19 is electrically connected with the switch unit 13 through a power line 191 and a control line 193, wherein the control unit 19 provides a voltage Vcc to the switch unit 13 through the power line 191, and also provides a control signal to the switch unit 13 through the control line 193, thereby switching the operation mode of the switch unit 13.

In this embodiment, the control unit 19 can switch the switch unit 13. Thus, the antenna unit 11 is electrically connected to the transmitting unit 17 through the switch unit 13, so that the transmitting unit 17 can transmit a signal through the switch unit 13 to the antenna unit 11, driving the antenna unit 11 to transmit a wireless signal. The control unit 19 can also switch the switch unit 13, enabling the antenna unit 11 to be electrically connected to the receiving path 15 through the switch unit 13, so that the antenna unit 11 can transmit a received wireless signal through the switch unit 13 to the receiving path 15. Thus, the RF Front-end 10 can receive or transmit wireless signals.

The RF Front-end 10 enters standby mode when it is out of the wireless signal receiving or transmitting process. At this time, the control unit 19 does not provide the power supply voltage Vcc to the switch unit 13, thereby saving standby mode current consumption. Further, the switch unit 13 isolates the antenna unit 11, the receiving path 15 and the transmitting unit 17 at the standby mode.

SUMMARY OF THE PRESENT INVENTION

It is the main object of the present invention to provide a method for improving the isolation characteristic of a switching device by: providing an isolation voltage to the switch unit after the switching device has entered standby mode, wherein the isolation voltage is smaller than or equal to the normal operating voltage of the switching device. Providing an isolation voltage to the switch unit enables the switching device and/or the switch unit to have an enhanced isolation characteristic and to effectively prevent transmission of high frequency signals between end-points of the switch unit during standby mode.

It is another object of the present invention to provide a method capable of improving the isolation characteristic of a switching device, which can be used in an RF Front-end having a switching device or a wireless transceiver so that when the RF Front-end is out of the wireless signal receiving or transmitting operation, or in standby mode, the control unit provides an isolation voltage to the switch unit, preventing high frequency signals from passing over the switch unit to go between the antenna unit, the transmitting path and the receiving path.

It is still another object of the present invention to provide a method capable of improving the isolation characteristic of a switching device, which comprises a switch unit and a control unit, wherein the control unit comprises at least one voltage regulator unit. The voltage regulator unit has its one end electrically connected to a power supply terminal, and its other end electrically connected to the switch unit through at least one power line. When the switching device enters standby mode, the voltage regulator unit provides an isolation voltage to the switch unit, improving the isolation characteristic of the switch unit.

It is still another object of the present invention to provide a method capable of improving the isolation characteristic of a switching device, which comprises a switch unit and a control unit, wherein the control unit comprises a voltage regulator unit and at least one voltage division unit. The voltage regulator unit and the voltage division unit have the respective one ends thereof electrically connected to a power supply terminal, and the respective other ends thereof electrically connected through at least one power line to the switch unit. When the switching device enters standby mode, an isolation voltage is provided to the power line of the switch unit through the voltage division unit to improve the isolation characteristic of the switch unit.

It is still another object of the present invention to provide a method capable of improving the isolation characteristic of a switching device, which can be integrated into a RF Front-end or transceiver so that when the RF Front-end or transceiver is out of the wireless signal receiving or transmitting operation, the control unit provides an isolation voltage to the switch unit, preventing high frequency signals from passing over the switch unit to go between the antenna unit, the transmitting path and the receiving path.

To achieve these and other objects of the present invention, the present invention provides a switching device having a good isolation characteristic, comprising: a switch unit; and a control unit electrically connected to a power supply terminal, and electrically connected to the switch unit through at least one control line and at least one power line, wherein the power supply terminal is electrically connected to the power line, the control unit comprising: at least one voltage division unit electrically connected to the power supply terminal or electrical connected to the switch unit through the power line; and a switching unit electrically connected to the voltage division unit and adapted for switching electric connection between the voltage division unit and the at least one power line.

The present invention provides a method of improving the isolation characteristic of a switching device, the switching device comprising a switch unit and a control unit, the control unit providing a power supply voltage to the switch unit, the switch unit comprising a plurality of connection lines, the method comprising the steps of: enabling the switch unit to enter standby mode, wherein the signal ports of the switch unit are electrically disconnected from one another when the switch unit enters standby mode; and enabling the switch unit to provide an isolation voltage, wherein the isolation voltage being smaller than or equal to the power supply voltage.

In one embodiment of the switching device, further comprises a voltage regulator unit electrically connected to the power supply terminal and electrically connected to the switch unit through the power line to provide a power supply voltage to the switch unit.

In one embodiment of the switching device, the switch unit comprises at least one first connection line, at least one second connection line and at least one third connection line.

In one embodiment of the switching device, the at least one first connection line or connection port is electrically connected to one of the at least one second connection line or connection port and the at least one third connection line or connection port through the switch unit.

In one embodiment of the switching device, the at least one first connection line or connection port is electrically connected to an antenna unit; the at least one second connection line or connection port establishes a transmitting path; the at least one third connection line or connection port establishes a receiving path.

In one embodiment of the switching device, the number of the at least one voltage division unit is plural, and these multiple the voltage division units are electrically connected in series electrically connected to the power supply terminal and grounded; the at least one power line is electrically connected between the voltage division units in series.

In one embodiment of the switching device, the power supply terminal provides an isolation voltage through at least one the voltage division unit to the switch unit, the isolation voltage being smaller than or equal to the power supply voltage.

In one embodiment of the method, the control unit is electrically connected to a power supply terminal and electrically connected through at least one control line to the switch unit, the control unit comprising: a voltage regulator unit electrically connected to the power supply terminal and electrically connected through at least one power line to the switch unit to provide a power supply voltage to the switch unit; at least one voltage division unit electrically connected to the power supply terminal or the at least one power line; and a switching unit electrically connected to the at least one voltage division unit and adapted for switching electric connection between the at least one voltage division unit and the at least one power line.

In one embodiment of the method, the method further comprises the step of: turning off the voltage regulator unit to stop providing a power supply voltage to the switch unit.

In one embodiment of the method, the method further comprises the step of: enabling the at least one voltage division unit to be electrically conducted to the at least one power line for providing an isolation voltage through the at least one power line to the switch unit.

In one embodiment of the method, the control unit is electrically connected to the switch unit through at least one control line and capable of switching the switch unit to the standby mode via the at least one control line.

In one embodiment of the method, the control unit is electrically connected to the power supply terminal and electrically connected to the switch unit through at least one control line, the control unit comprising a voltage regulator unit electrically connected to the power supply terminal and electrically connected to the switch unit through the at least one power line and adapted to provide a power supply voltage to the switch unit.

In one embodiment of the method, the method further comprises the step of: changing the power supply voltage being outputted by the voltage regulator unit so that the voltage regulator unit is capable of providing the isolation voltage to the switch unit; the isolation voltage is smaller or equal to the power supply voltage.

In one embodiment of the method, the method further comprises the step of: enabling the control unit to switch the switching device to the standby mode via the at least one control line.

Other advantages and features of the present invention will be fully understood by reference to the following specification in conjunction with the accompanying drawings, in which like reference signs denote like components of structure.

DETAILED DESCRIPTION OF THE PREFERRED EMBODIMENTS

Figure 2:
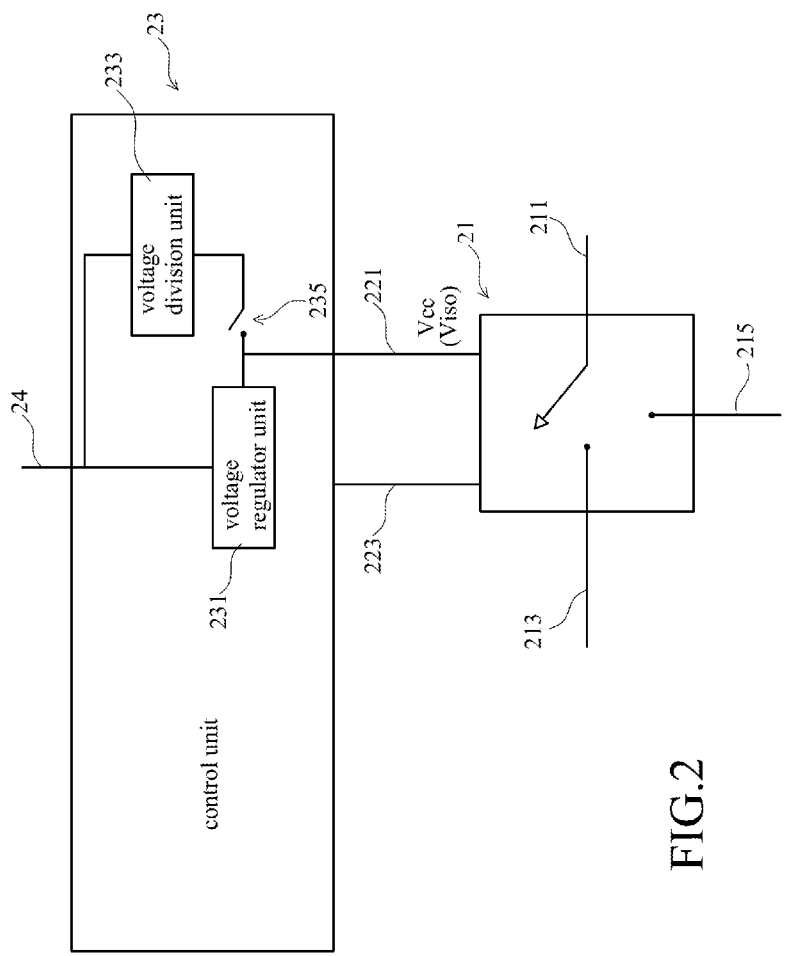
FIG. 2 is a schematic connection diagram of a switching device having a good isolation characteristic in accordance with the present invention.

Please refer to FIG. 2, where a schematic connection diagram of a switching device having a good isolation characteristic in accordance with the present invention is shown. As illustrated, the switching device 20 comprises a switch unit 21 and a control unit 23, wherein the control unit 23 is electrically connected to a power supply terminal 24, and electrically connected with the switch unit 21 through at least one power line 221 and at least one control line 223.

The control unit 23 is connected to the power supply terminal 24, and provides a power supply voltage Vcc to the switch unit 21 via the power line 221. Further, the control unit 23 is connected to the switch unit 21 via the control line 223, and then provides at least one control signal to the switch unit 21 to control the operation mode of the switch unit 21.

In this embodiment, the control unit 23 comprises a voltage regulator unit 231, at least one voltage division unit 233 and a switching unit 235, wherein the voltage regulator unit 231 can be a linear LDO (Low Dropout) voltage regulator. The voltage regulator unit 231 is electrically connected to the power supply terminal 24 and also electrically connected to the switch unit 21 through the power line 221, and adapted to provide a power supply voltage Vcc through the power line 221 to the switch unit 21.

The voltage division unit 233 is electrically connected to the power supply terminal 24 and the power line 221 in such a manner that the voltage division unit 233 and the voltage regulator unit 231 are arranged in parallel. In this embodiment, the voltage division unit 233 is electrically connected to the switching unit 235, and adapted to switch electric connection between the voltage division unit 233 and the power end of the power line 221 by means of the switching unit 235, and also to switch electric connection status between the voltage division unit 233 and the power line 221 by means of the switching unit 235.

The switch unit 21 comprises a plurality of connection lines. In this embodiment, the switch unit 21 comprises at least one first connection line or port 211, at least one second connection line or port 213 and at least one third connection line or port 215. Through the switch unit 21, the first connection line 211 and second connection line 213 can be electrically connected for allowing transmission of a signal between the first connection line 211 and second connection line 213. Alternatively, through the switch unit 21, the first connection line 211 and third connection line 215 can be electrically connected for allowing transmission of a signal between the first connection line 211 and third connection line 215. Further, the first connection line 211 can be electrically connected to an antenna unit (not shown); the second connection line 213 can be a transmitting path; the third connection line 215 can be a receiving path.

During the operation of the switching device 20, the switch unit 235 is off, and the voltage division unit 233 is electrically disconnected from the voltage regulator unit 231 and/or the power line 221. At this time, the voltage regulator unit 231 provides a power supply voltage Vcc to the switch unit 21 via the power line 221, maintaining normal functioning of the switch unit 21.

When the RF Front-end or transceiver is not in a wireless signal receiving or transmitting operation, the switch unit 21 enters standby mode. At this time, the control unit 23 can switch the switch unit 21 to standby mode by means of the control line 223. When in standby mode, the connection lines of the switch unit 21 are disconnected from one another, and/or the switch unit 21 does not transmit signals. For example, the first connection line 211 and the second connection line 213 or third connection line 215 are disconnected from one another, enabling the switching device 20 to enter standby mode. At this time, the switch unit 235 is on, thus, the voltage division unit 233 and the power line 221 are electrically connected, and the voltage regulator unit 231 is off, and therefore the voltage regulator unit 231 stops providing the power supply voltage Vcc to the switch unit 21.

The voltage division unit 233 connects the power supply terminal 24 and the power line 211. The voltage of the power supply terminal 24 goes through the voltage division unit 233 and then produces a voltage drop, forming an isolation voltage Viso. The voltage value of the isolation voltage Viso is so determined that the switch unit 21 has a good enough port to port isolation when off, preventing signal transmission between circuit lines or between ports thereof, wherein the isolation voltage Viso can be smaller than or equal to the power supply voltage Vcc. The isolation voltage Viso is transmitted through the power line 221 to the switch unit 21, enhancing isolation between the connection lines or ports of the switch unit 21.

In one embodiment of the present invention, the isolation voltage Viso is in the range of 0.5V-2V. However, this voltage range is simply an example and not intended to limit the scope of the claims of the present invention.

Figure 1:
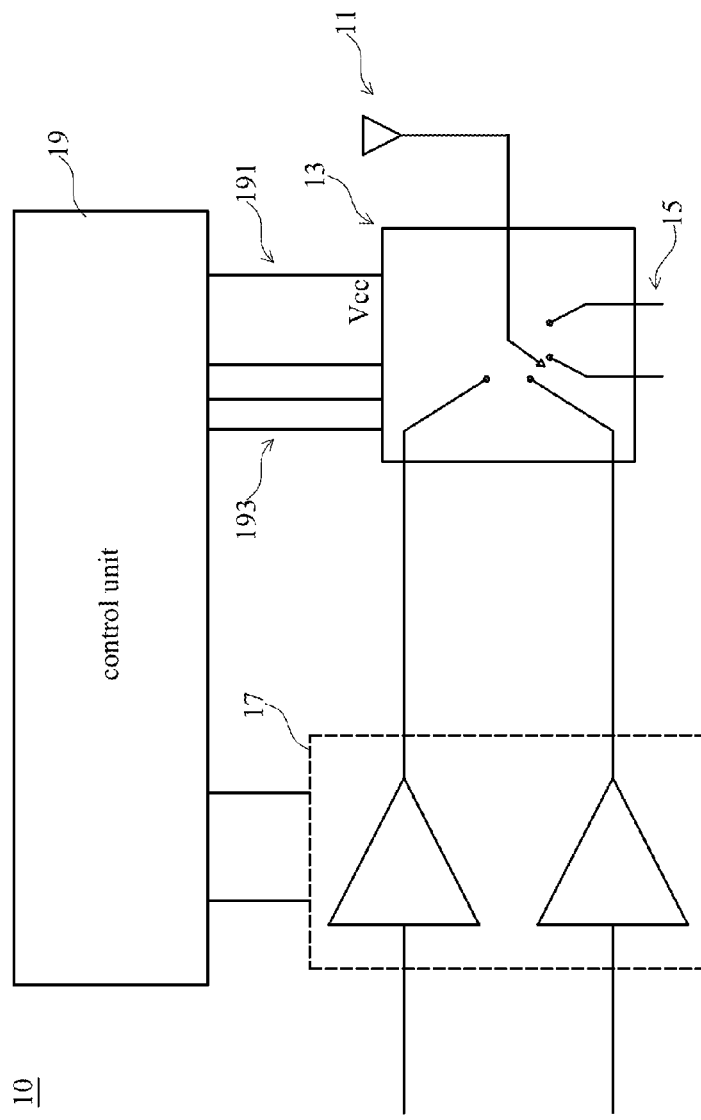
FIG. 1 is a schematic circuit block diagram of a RF Front-end having a switch unit according to the prior art.

Referring also to FIG. 1, when the switch unit 13 of the prior art design is in standby mode, the control unit 19 does not provide the power supply voltage Vcc to the switch unit 13, and simply uses the intrinsic characteristic of switch unit 13 to isolate the antenna unit 11, the receiving path 15 and the transmitting unit 17. In actual application, if no power supply voltage is provided to the switch unit 13 when the switch unit 13 is in standby mode, it cannot effectively isolate the paths among the antenna unit 11, the receiving path 15 and the transmitting unit 17, and some signals (such as high frequency signals) still can pass through the switch unit 13 and go between the antenna unit 11, the receiving path 15 and/or the transmitting unit 17. When compared with the prior art design, the voltage division unit 233 of the control unit 23 will provide an isolation voltage Viso through the power line 221 to the switch unit 21 as the switching device 20 is in standby mode, enabling the switch unit 21 to effectively isolate signals between the first connection line or port 211, the second connection line or port 213 and/or the third connection line or port 215, improving the isolation characteristic between the connection lines of the switch unit.

Figure 3:
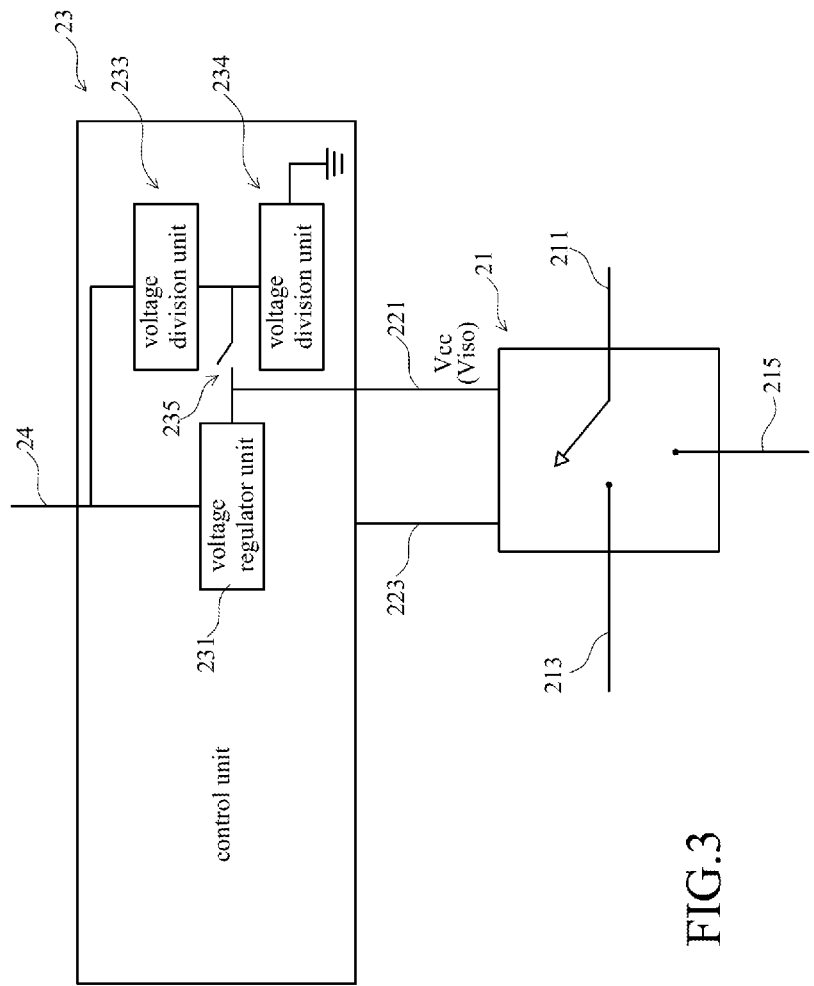
FIG. 3 is a schematic connection diagram of an alternate form of the switching device in accordance with the present invention.

In another embodiment of the present invention, as illustrated in FIG. 3, the isolation voltage (Viso) can be obtained by component voltage division, for example, by dividing the voltage across the voltage division unit 233 and the voltage division unit 234, wherein the voltage division unit 233 and the voltage division unit 234 can be resistors, diodes, transistors, or their combinations. The voltage division unit 233 and the voltage division unit 234 are electrically connected in series. The voltage division unit 233 has one end thereof electrically connected to the power supply terminal 24, and an opposite end thereof electrically connected to one end of the voltage division unit 234. The voltage division unit 234 has an opposite end thereof grounded. The power line 221 is electrically connected between the voltage division unit 233 and the voltage division unit 234 through a switching unit 235. The voltage of the power supply terminal 24 is divided across the voltage division unit 233 and voltage division unit 234, forming an isolation voltage Viso that is electrically connected to the power line 221 through the switching unit 235, and thus, a proper isolation voltage Viso is provided to the switch unit 21.

In one embodiment of the invention, the voltage regulator unit 231 can be omitted, such that the power supply terminal 24 connects to the power line 221 directly to provide a power supply voltage Vcc to the switch unit 21.

Figure 4:
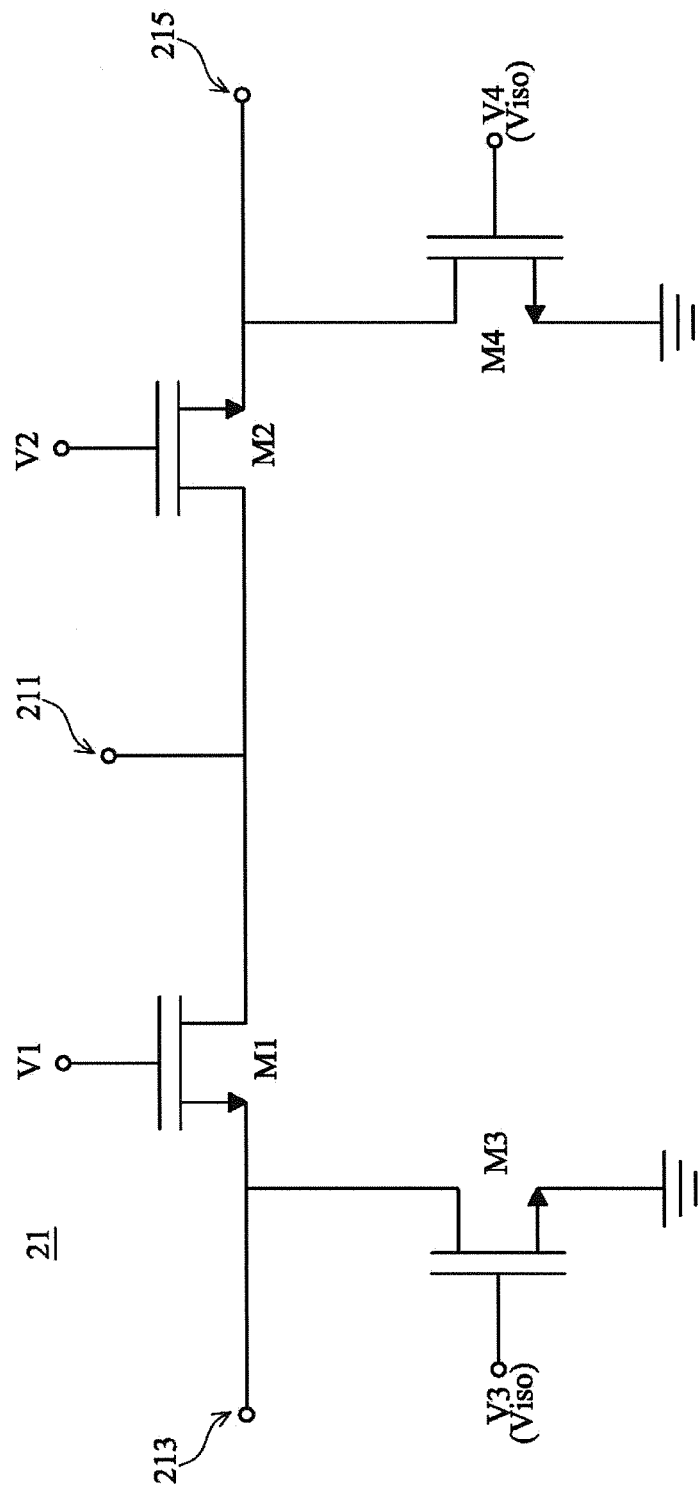
FIG. 4 is a schematic circuit diagram of a switch unit in accordance with the present invention.

Referring also to FIG. 4, in one embodiment of the present invention, the switch unit 21 is a SDPT (Single-Pole Double-Throw Switch), however, in actual application, this design is not a limitation. The switch unit 21 comprises a first transistor M1, a second transistor M2, a third transistor M3, a fourth transistor M4, a first connection line or port 211, a second connection line or port 213 and a third connection line or port 215.

The first transistor M1 is connected between the first connection line 211 and the second connection line 213, and the second transistor M2 is connected between the first connection line 211 and the third connection line 215. The first transistor M1 has a first control voltage V1 connected thereto, and the second transistor M2 has a second control voltage V2 connected thereto. Through the first control voltage V1 and the second control voltage V2, the first transistor M1 and the second transistor M2 can be turned on or off.

The third transistor M3 is electrically connected to the first transistor M1, and has a third control voltage V3 connected thereto. The fourth transistor M4 is electrically connected to the second transistor M2, and has a fourth control voltage V4 connected thereto. Through the third control voltage V3 and fourth control voltage V4, the third transistor M3 and the fourth transistor M4 can be turned on or off. Further, the third control voltage V3 can be the reverse voltage of the first control voltage V1, and the fourth control voltage V4 can be the reverse voltage of the second control voltage V2.

In one embodiment of the present invention, it can turn on the first transistor M1 and the fourth transistor M4 and turn off the second transistor M2 and the third transistor M3 to conduct the first connection line 211 and the second connection line 213. It can also turn off the first transistor M1 and the fourth transistor M4 and turn on the second transistor M2 and third transistor M3 to conduct the first connection line 211 and the third connection line 215.

When the switch unit 21 enters standby mode, turn off the first transistor M1 and the second transistor M2, and provide an isolation voltage Viso to the third transistor M3 and the fourth transistor M4. The voltage value of this isolation voltage enables the third transistor M3 and fourth transistor M4 to be turned on, enhancing the isolation of the switch unit 21 in standby mode, wherein the isolation voltage Viso can be smaller than or equal to the power supply voltage Vcc, for example, enabling the third control voltage V3 and the fourth control voltage V4 to be equal to the isolation voltage Viso.

Figure 5:
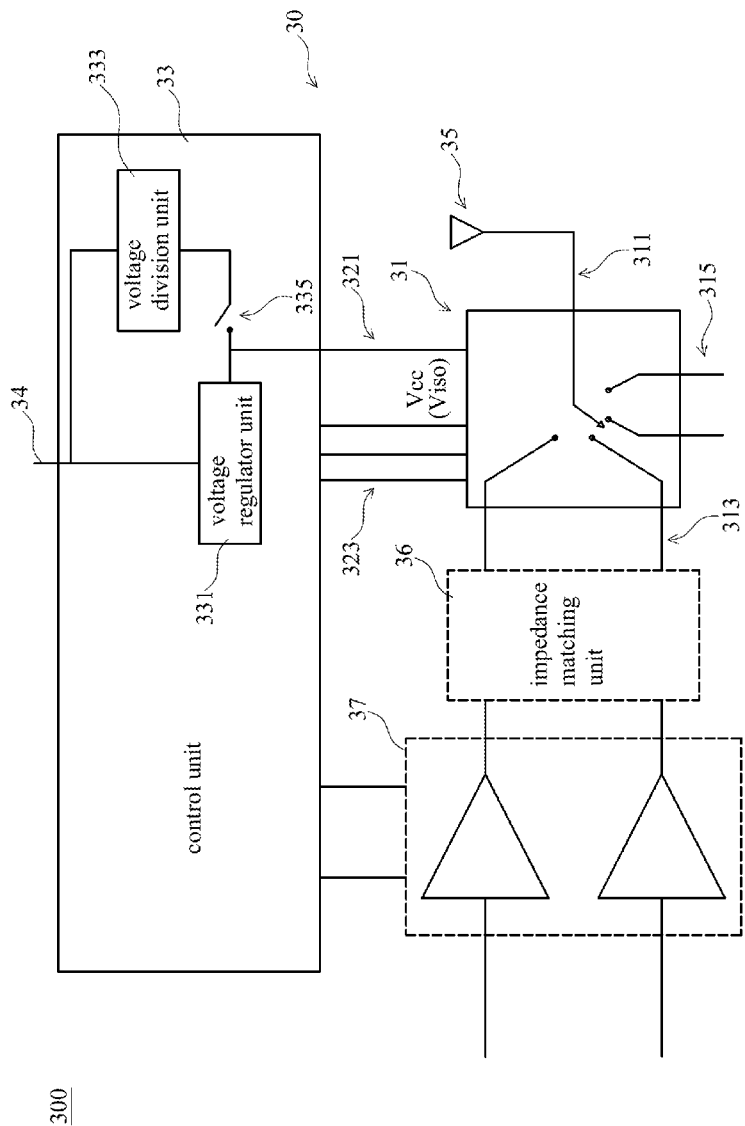
FIG. 5 is a schematic connection diagram of an RF Front-end using the switching device in accordance with the present invention.

Referring to FIG. 5, a schematic connection diagram of an RF Front-end 300 using the switching device in accordance with the present invention is shown. As illustrated, the switching device 30 comprises a switch unit 31 and a control unit 33, wherein the control unit 33 is electrically connected to a power supply terminal 34, and electrically connected through at least one power line 321 and at least one control line 323 to the switch unit 31.

The control unit 33 is electrically connected to the power supply terminal 34, and adapted to provide a power supply voltage Vcc through the power line 321 to the switch unit 31. Further, the control unit 33 can provide at least one control signal through the control line 323 to the switch unit 31 to control the operation mode of the witch unit 31.

In this embodiment, the control unit 33 comprises a voltage regulator unit 331, at least one voltage division unit 333 and a switching unit 335, wherein the voltage regulator unit 331 can be a linear LDO (Low Dropout) voltage regulator.

The voltage regulator unit 331 is electrically connected to the power supply terminal 34, and electrically connected through the power line 321 to the switch unit 31. The voltage division unit 333 is electrically connected to the power supply terminal 34 and power line 321, and thus, the voltage division unit 333 and voltage regulator unit 331 are arranged in parallel. Further, the voltage division unit 333 can be connected to the power line 321 or the power supply terminal 34 through the switching unit 335. Subject to the switching operation of the switching unit 335, the electrical connection status between the voltage division unit 333 and the power line 321 is controlled.

The switch unit 31 comprises a plurality of connection lines. For example, the switch unit 31 can be configured to comprise at least one first connection line or port 311, a plurality of second connection lines or ports 313 and a plurality of third connection lines or ports 315.

In this embodiment, the switching device 30 is used in an RF Front-end 300, wherein the first connection line 311 is electrically connected to an antenna unit 35; the second connection line 313 is a transmitting path and electrically connected to a transmitting unit 37 directly or through an impedance matching unit 36; the third connection line 315 is a receiving path.

In actual application, the switch unit 31 can be switched to the at least one second connection line 313, enabling the first connection line 311 to be electrically connected through the switch unit 31 to the at least one second connection line 313 for transmitting the signal of the transmitting unit 37 through the second connection line 313, the switch unit 31 and the first connection line 311 to the antenna unit 35, and thus, the RF Front-end 300 can transmit a wireless signal.

Further, the switch unit 31 can also be switched to the third connection line 315, enabling the first connection line 311 to be electrically connected through the switch unit 31 to the at least one third connection line 315 for transmitting a received signal from the antenna unit 35 through the first connection line 311 and the switch unit 31 to the third connection line 315, and thus, the RF Front-end 300 can receive a wireless signal.

When the RF Front-end 300 is stopped from receiving or transmitting a wireless signal, the switching device 30 enters standby mode. At this time, the switching unit 335 is turned on, enabling the voltage division unit 333 and the power line 321 to be electrically conducted, and the voltage regulator unit 331 to be turned off.

The voltage division unit 333 is electrically conducted to the power supply terminal 34 and the power line 321. Thus, when the voltage of the power supply terminal 34 passes through the voltage division unit 333, it produces a voltage drop, thereby forming an isolation voltage Viso. The voltage value of this isolation voltage Viso is so determined that when the switch unit is turned off, a good enough port to port isolation of the switch unit 31 can be provided, preventing signal transmission between circuit lines, wherein the isolation voltage Viso can be smaller than or equal to the power supply voltage Vcc. The isolation voltage Viso can go through the power line 321 to the switch unit 31 to enhance the isolation characteristic of the switch unit 31. Preferably, the isolation voltage Viso is in the range of 0.5V-2V. However, this voltage range is simply an example and not intended to limit the scope of the claims of the present invention.

Figure 6:
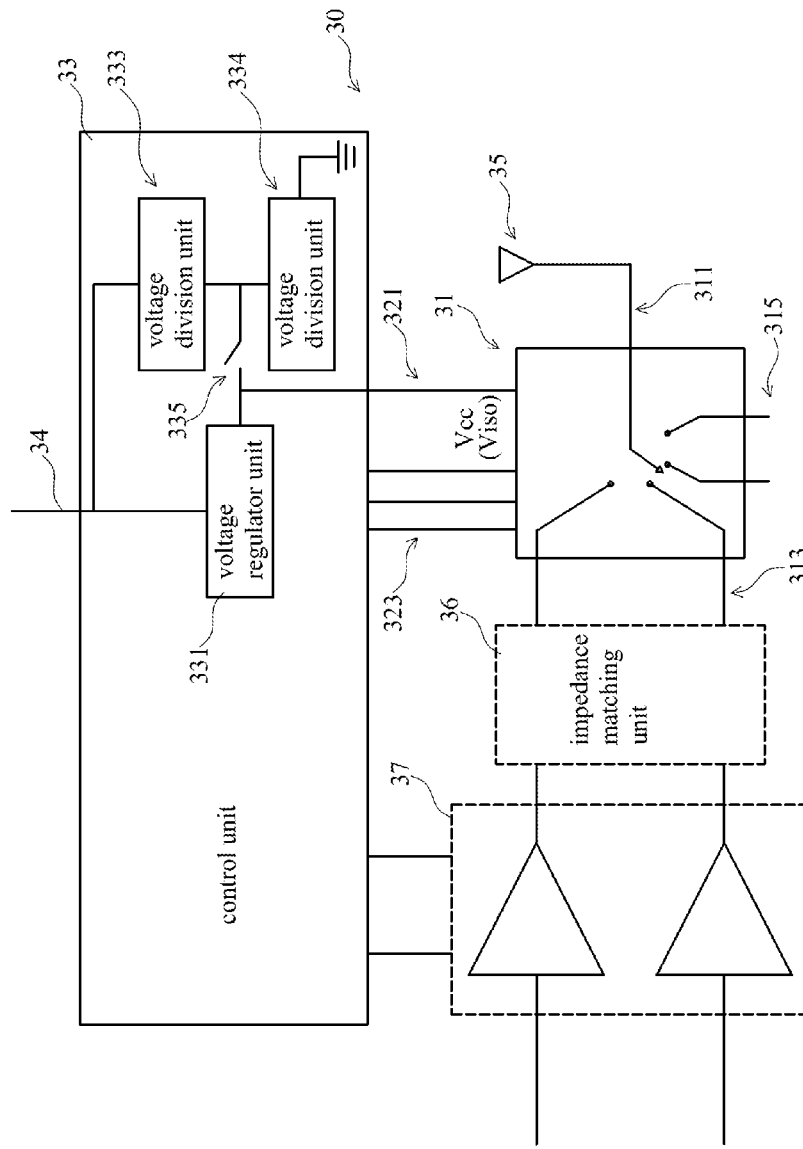
FIG. 6 is a schematic connection diagram of an alternate form of the RF Front-end in accordance with the present invention.

In another embodiment of the present invention, as illustrated in FIG. 6, the isolation voltage Viso is generated by dividing the voltage across a series of components, for example, by dividing the voltage across the voltage division unit 333 and the voltage division unit 334, wherein the voltage division units 333 and 334 can be resistors, diodes, transistors, or their combinations. The voltage division unit 333 and the voltage division unit 334 are electrically connected in series. The voltage division unit 333 has one end thereof electrically connected to the power supply terminal 34, and an opposite end thereof electrically connected to one end of the voltage division unit 334. The voltage division unit 334 has an opposite end thereof grounded. The power line 321 is electrically connected between the voltage division unit 333 and the voltage division unit 334 through a switching unit 335. The voltage of the power supply terminal 34 is divided across the voltage division unit 333 and the voltage division unit 334, thereby producing an isolation voltage Viso that is connected through the switch unit 335 to the power line 321, and thus, a proper isolation voltage Viso is provided to the switch unit 31.

Figure 7:
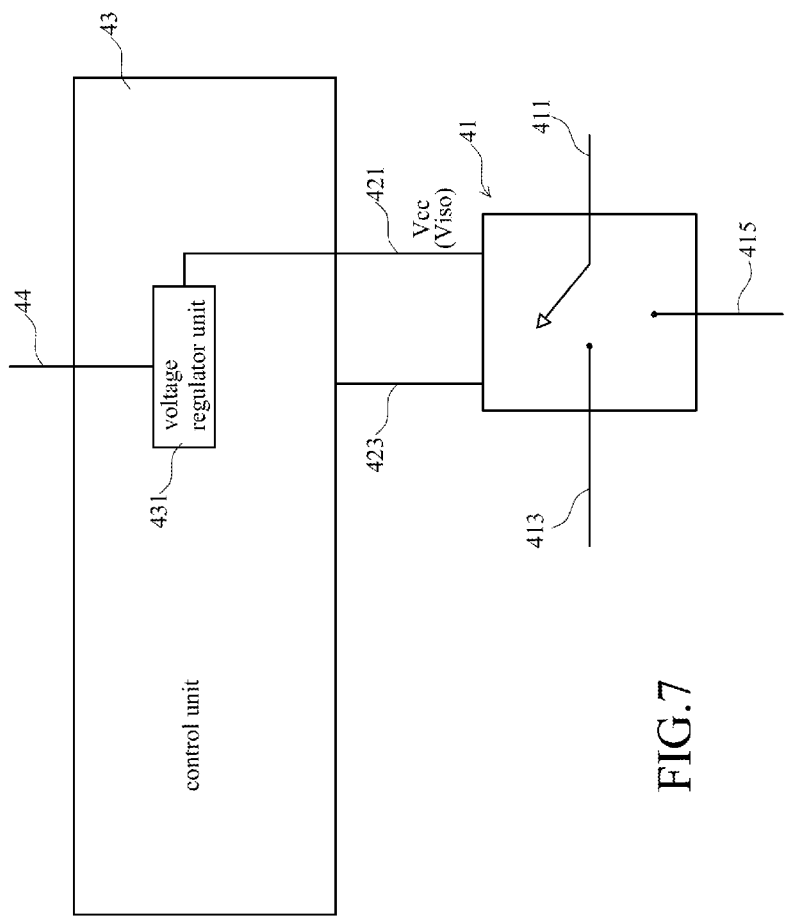
FIG. 7 is a schematic connection diagram of another alternate form of the switching device in accordance with the present invention.

Referring to FIG. 7, a schematic connection diagram of another alternate form of the switching device in accordance with the present invention is shown. According to this embodiment, the switching device 40 comprises a switch unit 41 and a control unit 43, wherein the control unit 43 is electrically connected to a power supply terminal 44, and electrically connected through at least one power line 421 and at least one control line 423 to the switch unit 41.

The control unit 43 is electrically connected to the power supply terminal 44, and provides a power supply voltage Vcc through the power line 421 to the switch unit 41. Further, the control unit 43 can be electrically connected through the control line 423 to the switch unit 41 to provide at least one control signal to the switch unit 41 to control the operation mode of the switch unit 41.

In this embodiment, the control unit 43 comprises a voltage regulator unit 431, wherein the voltage regulator unit 431 can be a linear LDO (Low Dropout) voltage regulator. The voltage regulator unit 431 is electrically connected to the power supply terminal 44, and electrically connected through the power line 421 to the switch unit 41 to provide a power supply voltage Vcc through the power line 421 to the switch unit 41.

In this embodiment, when the RF Front-end or transceiver is stopped from receiving or transmitting a wireless signal, the switch unit 41 enters standby mode. At this time, the control unit 43 switches the switch unit 41 to standby mode via the control line 423. In standby mode, the connection lines of the switch unit 41 are disconnected from one another, and/or the switch unit 41 is stopped from signal transmission, for example, the first connection line 411 and the second connection line 413 or third connection line 415 are not connected through the switch unit 41, enabling the switching device 40 to enter standby mode. At this time, the control unit 43 or the voltage regulator unit 431 changes its output voltage, directly regulating the power supply voltage Vcc into an isolation voltage Viso. The voltage value of the isolation voltage Viso is so determined that the switch unit 41 has a good enough port to port isolation when off, preventing signal transmission between circuit lines thereof, wherein the isolation voltage Viso can be smaller than or equal to the power supply voltage Vcc. The isolation voltage Viso is transmitted through the power line 421 to the switch unit 41, enhancing isolation between each two connection lines of the switch unit 41.

In the aforesaid various embodiments of the present invention, the term of "connection" means direct connection between objects or components, or indirect connection between objects or components by means of one or multiple intermediate connection means.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A switching device having a good isolation characteristic, comprising:
    a switch unit; and
    a control unit electrically connected to a power supply terminal, and electrically connected to said switch unit through at least one control line and at least one power line, wherein said power supply terminal is electrically connected to said power line, said control unit comprising:
        at least one voltage division unit electrically connected to said power supply terminal or electrically connected to said switch unit through said power line;
        a switching unit electrically connected to said voltage division unit and adapted for switching electric connection between said voltage division unit and said at least one power line; and
        a voltage regulator unit electrically connected to said power supply terminal and electrically connected to said switch unit through said power line to provide a power supply voltage to said switch unit.

2. The switching device as claimed in claim 1, wherein said switch unit comprises at least one first connection line, at least one second connection line and at least one third connection line.

3. The switching device as claimed in claim 2, wherein said at least one first connection line is electrically connected to one of said at least one second connection line and said at least one third connection line through said switch unit.

4. The switching device as claimed in claim 2, wherein said at least one first connection line is electrically connected to an antenna unit; said at least one second connection line establishes a transmitting path; said at least one third connection line establishes a receiving path.

5. The switching device as claimed in claim 1, wherein the number of said at least one voltage division unit is plural, and these multiple said voltage division units are electrically connected in series electrically connected to said power supply terminal and ground; and said at least one power line is electrically connected between said voltage division units in series.

6. The switching device as claimed in claim 1, wherein an isolation voltage is provided through at least one said voltage division unit to said switch unit, said isolation voltage being smaller than or equal to said power supply voltage.

7. A method of improving the isolation characteristic of a switching device, said switching device comprising a switch unit and a control unit, said control unit providing a power supply voltage to said switch unit, said switch unit comprising a plurality of connection lines, the method comprising the steps of:
    enabling said switch unit to enter standby mode, wherein said connection lines of said switch unit are disconnected from one another when said switch unit enters standby mode; and
    providing an isolation voltage to said switch unit, said isolation voltage being smaller than or equal to said power supply voltage;
    wherein said control unit is electrically connected to a power supply terminal and electrically connected through at least one control line and at least one power line to said switch unit, wherein said power supply terminal is electrically connected to said power line, said control unit comprising:
    at least one voltage division unit electrically connected to said power supply terminal or electrically connected to said switch unit through said power line;
    a switching unit electrically connected to said at least one voltage division unit and adapted for switching electric connection between said at least one voltage division unit and said at least one power line; and
    a voltage regulator unit electrically connected to said power supply terminal and electrically connected to said switch unit through said power line to provide a power supply voltage to said switch unit.

8. The method as claimed in claim 7, further comprising the step of: turning off said voltage regulator unit to stop providing said power supply voltage to said switch unit.

9. The method as claimed in claim 8, further comprising the step of: enabling said at least one voltage division unit to be electrically conducted to said at least one power line for providing said isolation voltage through said at least one power line to said switch unit.

10. The method as claimed in claim 7, wherein said control unit is electrically connected to said switch unit through at least one control line and capable of switching said switch unit to said standby mode via said at least one control line.

11. A method of improving the isolation characteristic of a switching device, said switching device comprising a switch unit and a control unit, said control unit providing a power supply voltage to said switch unit, said switch unit comprising a plurality of connection lines, the method comprising the steps of:

enabling said switch unit to enter standby mode, wherein said connection lines of said switch unit are disconnected from one another when said switch unit enters standby mode; and providing an isolation voltage to said switch unit, wherein said isolation voltage being smaller than or equal to said power supply voltage;

wherein said control unit is electrically connected to said power supply terminal and electrically connected to said switch unit through at least one control line, said control unit comprising a voltage regulator unit electrically connected to said power supply terminal and electrically connected to said switch unit through at least one power line and adapted to provide said power supply voltage to said switch unit.

12. The method as claimed in claim 11, further comprising the step of: changing said power supply voltage being outputted by said voltage regulator unit so that said voltage regulator unit is capable of providing said isolation voltage to said switch unit; said isolation voltage is smaller or equal to said power supply voltage.

13. The method as claimed in claim 11, further comprising the step of: enabling said control unit to switch said switching device to said standby mode via said at least one control line.

* * * * *